United States Patent [19]

Golker et al.

[11] Patent Number: 4,675,607

[45] Date of Patent: Jun. 23, 1987

[54] MAGNETIC FIELD PROBE WITH IMPROVED POSITIONING OF A WINDING AND CORE PLATE THEREOF RELATIVE TO A HOUSING OF THE PROBE

[75] Inventors: Walter Golker; Horst Tamm, both of Munich; Eberhard Wanka, Dachau, all of Fed. Rep. of Germany

[73] Assignee: Siemens Aktiengesellschaft, Berlin and Munich, Fed. Rep. of Germany

[21] Appl. No.: 804,396

[22] Filed: Dec. 4, 1985

[30] Foreign Application Priority Data

Oct. 24, 1985 [DE] Fed. Rep. of Germany ....... 3537921

[51] Int. Cl.[4] .................. G01R 33/02; G01V 3/40; H01F 27/02
[52] U.S. Cl. .................. 324/247; 174/52 R; 324/260; 324/262; 336/92
[58] Field of Search ........... 324/244, 247, 253-255, 324/260, 262, 156, 149; 174/52 R; 336/65, 90, 92, 96; 361/331, 380, 417, 419; 33/355 R, 356

[56] References Cited

U.S. PATENT DOCUMENTS

| | | | |
|---|---|---|---|
| 2,968,000 | 1/1961 | Pfeffer | 324/156 X |
| 3,054,024 | 9/1962 | Van Dillen et al. | 174/52 R X |
| 3,371,302 | 2/1968 | Mas | 336/92 |
| 3,964,009 | 6/1976 | Bernstein et al. | 174/52 R X |
| 4,047,061 | 9/1977 | Kilmer et al. | 336/90 X |
| 4,416,067 | 11/1983 | Scherer et al. | 33/356 |
| 4,503,395 | 3/1985 | Kratzer et al. | 324/253 |

FOREIGN PATENT DOCUMENTS

| | | |
|---|---|---|
| 0135933 | 4/1985 | European Pat. Off. |
| 2946640 | 10/1982 | Fed. Rep. of Germany |
| 3335333 | 4/1985 | Fed. Rep. of Germany |

*Primary Examiner*—Gerard R. Strecker
*Attorney, Agent, or Firm*—Hill, Van Santen, Steadman & Simpson

[57] ABSTRACT

A magnetic field probe contains an injected coil body having a cloverleaf shape and on which two windings offset relative to one another by 90° are provided. The coil body is positionally fixed in precise fashion in recesses of a bipartite housing, and are fixed therein via supporting tabs. The housing is formed of two identically fashioned half shells which are joined to one another with a friction-type lock by means of fastening elements applied in complementary fashion relative to a center plane.

14 Claims, 6 Drawing Figures

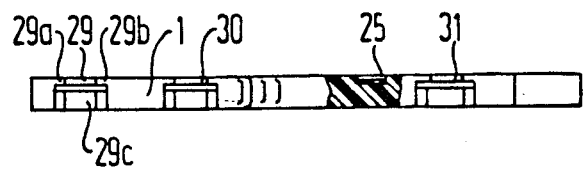
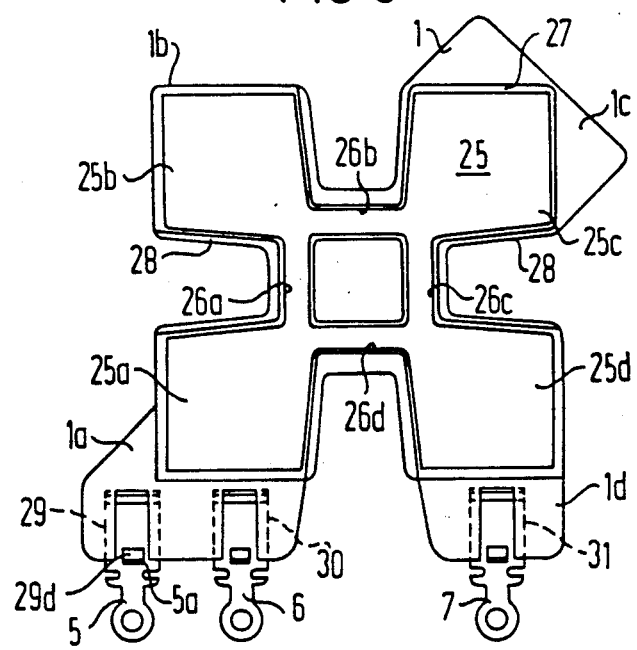
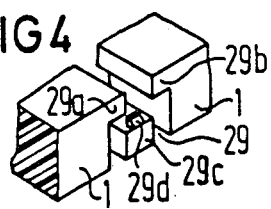

MAGNETIC FIELD PROBE WITH IMPROVED POSITIONING OF A WINDING AND CORE PLATE THEREOF RELATIVE TO A HOUSING OF THE PROBE

BACKGROUND OF THE INVENTION

The invention relates to a magnetic field probe comprising an approximately cross-shape formed core plate whose four legs are outwardly broadened in cloverleaf-shaped fashion into pole faces. Incisions are provided between the pole faces which respectively proceed in a direction toward the center. The magnetic field probe has a flat carrier formed of insulating material on which the core plate rests in surface-wide fashion and comprises lateral incisions approximately matched to the incisions of the core plate. The magnetic field probe also has two windings over the carrier and the core plate cross-wise above one another and at right angles relative to one another in the incisions, as well as a bipartite housing accepting the carrier and having a passage for a lead cable.

Such a magnetic field probe is disclosed in European OS No. 135 933, incorporated herein by reference. Proposed therein as a carrier for the core plate and for the windings is the use of a printed circuit board which is essentially adapted to the contours of the core plate. Given such a planarly fashioned printed circuit board, however, it only becomes possible to position the core plate exactly with respect to the windings by means of additional techniques. Such a positioning, however, is extremely important for the later function of the magnetic field probe because, once a dimensioning of an evaluation circuit has been prescribed, the measured values are only correct when the core plate is always exactly positioned in the intended position relative to the windings. Of course, it is also important for the evaluation that the core plate together with the carrier be exactly positioned relative to the outside dimensions of the housing in order to be able to implement an exact directional determination with the magnetic field probe. When, for example, the probe together with its housing are integrated in a vehicle, the alignment can only occur between the outside of the housing and the axis of the vehicle. It must, therefore, be assured that the windings and the core plate assume an exact position relative to the vehicle axis when this integration is carried out.

SUMMARY OF THE INVENTION

An object of the invention is to structurally design a magnetic field probe of the type initially cited such that a directionally precise positioning of the winding and of the core plate on the carrier is provided. Also, it is desirable that via the carrier the winding and core plate is accurately positioned in the housing. This is to occur in a simple manufacturing procedure in order to thus achieve precise measured results upon employment of the magnetic field probe for magnetic field measurement and for directional determination.

This object is achieved in accordance with the invention in that a coil body formed of plastic is employed as the carrier. This coil body comprises supporting tabs at the four ends lying between the windings, and respectively carries the pole faces of the core plate. It also has limiting ribs at one surface which are matched to the contours of the core plate. The housing is formed of two half shells. Each half shell comprises a central depression for the acceptance of the windings and comprises four flat recesses departing in cross-shaped fashion from the central depression, and which are at least partially matched to the contours of the supporting tabs and which form bearing surfaces for the supporting tabs at a depth which roughly corresponds to half the thickness of the supporting tabs.

With the invention, thus a molded member is employed as the coil body, the supporting tabs of this molded member representing a precisely shape-matched acceptance for the core plate so that the latter can be inserted in the simplest possible way, and thus positioned. Moreover, the housing is formed by two half shells which respectively comprise recesses corresponding to the support tabs of the coil body, so that the wound coil body is fixed in proper position between the half shells of the housing. No additional fastening elements for the coil body are thus required. The coil body with the windings is exactly fastened and fixed merely by inserting the coil body into the provided recesses and by connecting the two half shells.

In a preferred embodiment, the two half shells are fashioned identical in shape, whereby each half shell comprises complementary fastening elements situated symmetrically to a center plane residing perpendicularly on the common parting surface, and also comprises recesses formed symmetrically relative to the center plane. The passage for the connecting cable can be fashioned as a bore shared by both half shells, and whose axis lies in the intersection line between the parting plane and the center plane. This bore can also comprise ribs proceeding in a circumferential direction as protection for the cable against tension or pulling. In a practical development, each half shell also comprises an additional depression communicating with the passage in which solder terminals for the connecting cable lie. It is also provided in a further development that, as fastening elements, each half shell comprises a male plug-in member at at least one side of the center plane and comprises a bore with a matching diameter at the opposite side and at the same distance from the center plane. In order to form a friction-type lock between the half shells, the walls of the bore can respectively comprise ribs parallel to the axis which permit a penetration with the male plug-in members when the two half shells are joined together.

Since a correct-side arrangement is also required for the proper evaluation when the magnetic field probe is integrated in, for example, a vehicle, at least one of the two half shells can be provided with a marking which allows the upper side and the under side of the magnetic field probe to be distinguished from one another. Given identically shaped half shells, such a discrimination is preferably possible since the two half shells are formed of plastics of different colors.

At one of its flat sides, the coil body preferably has a planar recess for the acceptance of the core plate, whereby the depth of the recess corresponds to about the thickness of the core plate. The edge of the recess can thereby be impressed or stamped over the core plate at one or more locations by means of hot forming in order to fix the core plate. Furthermore, the coil body can be provided with injected solder terminal lugs. Provided in a particularly practical embodiment, however, is that the coil body comprises recesses for plug-type fastening of solder terminal lugs at those sides facing the housing passage. When the housing is to be closed in liquid-tight manner, the two half shells can respectively comprise a round rib in the region of their common parting plane. The shells can be welded to one another by means of these ribs, for example by ultrasound deformation.

BRIEF DESCRIPTION OF THE DRAWINGS

FIGS. 2 and 3 illustrate an unwound coil body provided with the core plate in two different views;

FIG. 4 illustrates a detail from FIG. 2 in a perspective view; and

DESCRIPTION OF THE PREFERRED EMBODIMENTS

Figure 1:
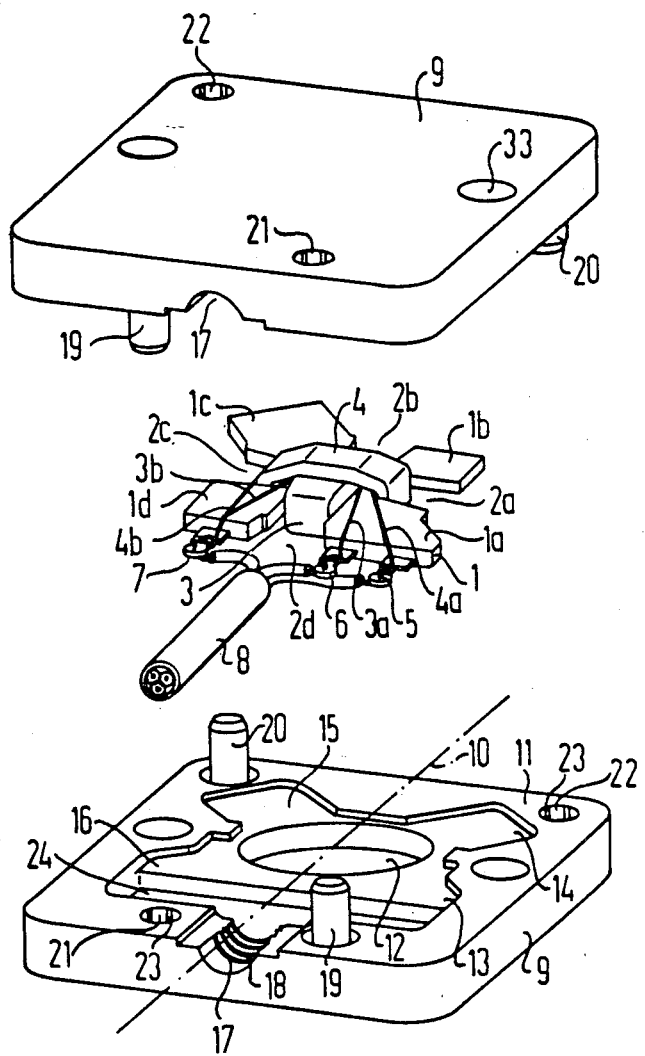
FIG. 1 is a magnetic field probe showing the two housing halves before being joined.

The magnetic field probe shown in FIG. 1 comprises a plate-shaped coil body 1 which is injected of plastic and roughly a cloverleaf shape. It has four tab-like supporting regions or tabs 1a through 1d which proceed in cross-shaped fashion from the center and spread toward the outside. A core plate which is situated at the underside of the coil body 1 and is not visible in FIG. 1 shall be described later. Two windings 3 and 4 are applied at an angle of 90° relative to one another. They are applied over the coil body in the incisions or cut-out areas 2a through 2d between the supporting tabs 1a through 1d and their lead-in wires 3a and 3b or lead-out wires 4a and 4b are led to solder lugs 5, 6, and 7 which are injected into the coil body 1 in this embodiment. A connecting lead 8 leads to the outside from the solder lugs 5 through 7. It leads to a known evaluation circuit for the magnetic field probe. Such circuits are disclosed, for example, by U.S. Pat. Nos. 4,503,395 or 4,416,067, both incorporated herein by reference.

The coil body 1 with the windings 3 and 4 is accommodated in a housing formed of two identical housing halves or half shells 9. The half shells are respectively symmetrically or complementarily fashioned relative to the parting plane 11 of the half shells which proceeds through the center line 10. Each half shell is symmetrical relative to a center plane passing through the center line 10 and perpendicular to the parting plane 11. Each half shell comprises a central depression 12 which serves for the acceptance of the windings 3 and 4. Four respective depressions 13, 14, 15, and 16 having a slight depth proceed from this central depression diagonally with respect to one another. These four depressions serve for the acceptance of the supporting tabs 1a through 1d and are at least partly adapted in contour to these supporting tabs so that the coil body 1 is positioned with a precise position in these recesses 13 through 16. The depth of the recesses 13 through 16 in each half shell roughly corresponds to one-half the thickness of the supporting tabs 1a through 1d, so that the coil body is seated with a precise fit in the housing with its support tabs when the two half shells 9 are joined together.

At one respective side, the two housing halves 9 comprise a semi-cylindrically designed part of a passage 17 for the cable 8. The axis of the passage lies precisely in the center line 10 at the intersection of the center plane with the parting surface or plane 11. Circumferentially proceeding ribs 18 serve as a safeguard against tension or pulling.

For the purpose of fastening the two half shells 9 to one another, they respectively comprise male plug-in members 19 and 20 as well as bores 21 and 22 situated symmetrically thereto with respect to the center plane 10. A friction-type lock results on the basis of ribs 23 in the bores when the two half shells 9 are joined.

At a region adjacent to the passage 17, the two half shells also comprise a further depression 24 which has sufficient space for the acceptance of the solder lugs 5, 6, and 7, or the lines of the cable 8 connected thereto.

FIGS. 2 and 3 show only the coil body 1: This coil body is rotated about axis 10 in FIG. 3 relative to FIG. 1 in order to show the underside thereof and thus to make the recess 27 for acceptance of the core plate 25 visible. This core plate likewise comprises an essential cloverleaf shape having four pole faces 25a through 25d between which respective incisions or cut-out areas 26a through 26d corresponding to the incisions 2a through 2d of the coil body 1 are provided. For acceptance, the coil body 1 comprises a recess 27 substantially matched in form to the shape of the core plate 25, the depth of this recess 27 roughly corresponding to the thickness of the core plate 25. A rib 28 which at least partially bounds this recess secures the core plate against lateral dislocation. As not shown in greater detail, this rib can be impressed or stamped by hot forming at one or more locations facing the core plate in order to additionally fix the core plate. The core plate 25 is rigidly connected to the coil member 1 by applying the windings 3 and 4 which are not shown in FIGS. 2 and 3.

In a departure from FIG. 1, the solder lugs 5 through 7 in FIGS. 2 and 3 are secured by plugging. For this purpose, recesses 29, 30, and 31 respectively proceeding inward from the end face are provided in the supporting tabs 1a and 1d of the coil body 1. These recesses are fashioned such that, when molding the coil body, dies respectively projecting from the under side and from the upper side respectively overlap so the two ribs, for example 29a and 29b at the upper side are provided, and a tongue 29c at the under side of the coil body is opposite the two ribs. Consequently, the corresponding solder lug, for example 5, can be clamped between the ribs and the tongue (see FIG. 4). At its free end, the tongue 29c comprises an upwardly projecting nose 29d which engages into a corresponding recess 5a of the solder terminal lug 6 and secures it from falling out (also see FIG. 3). The solder lugs 6 and 7 are secured by plugging in the same way.

Figure 5:
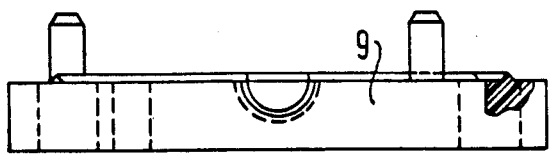
FIGS. 5 and 6 show a housing half in two different views.
Figure 6:
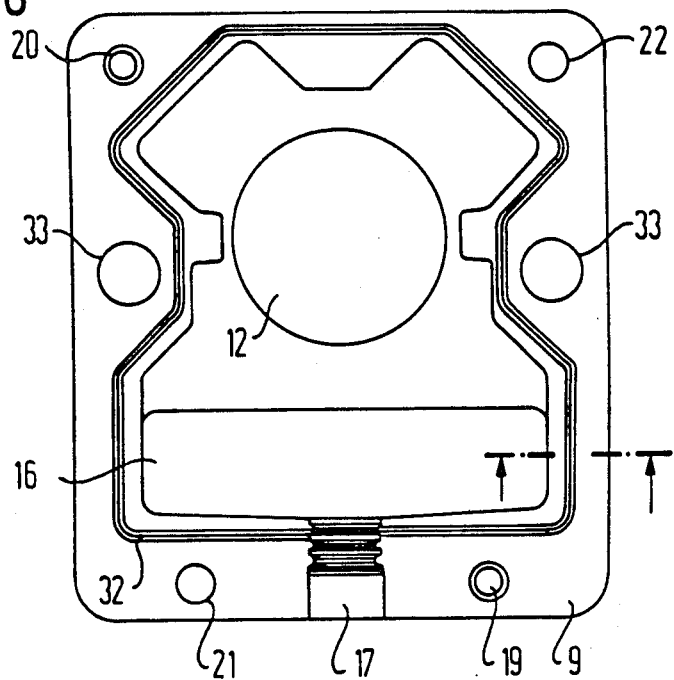

FIGS. 5 and 6 again show a housing half shell 9 in two different views. In a departure from FIG. 1, an additional, round rib 32 is applied. This can be deformed with ultrasound after the two half shells have been joined to one another. The two half shells are thus welded to one another in watertight fashion. In this case, the male members 19 and 20 in the corresponding bores 21 and 22 serve as a guide. The two half shells also comprise through-connecting bores 33 with which the magnetic field probe can be secured to a base, for example in a vehicle.

Although various minor changes and modifications might be proposed by those skilled in the art, it will be understood that we wish to include within the claims of the patent warranted hereon all such changes and modifications as reasonably come within our contribution to the art.

We claim as our invention:

1. A magnetic field probe, comprising:
    an approximately cross-shaped plate-like coil core of ferro-magnetic material having four legs outwardly extending in cloverleaf-shaped fashion which form pole faces;

cut-out areas between said pole faces which run approximately in a direction towards the center of the coil core plate;

an insulating material plate-shaped coil body having a recessed portion receiving said core plate, and having rib means at least partially bounding the core plate so as to at least partially define a receiving region, in which the core plate is aligned and inhibited from movement, and said coil having cut-out areas approximately matched with said cut-out areas of said core plate;

said coil body comprising plastic and having four tab-shaped core plate leg receiving portions defined by said cut-out areas and which carry said pole faces;

first and second windings at right angles to one another and around the coil body and core plate and running through said cut-out areas of the coil body and core plate;

a housing comprising first and second half-shells, each half-shell having a central depression portion and outer depression portions surrounding said central depression portion, said outer depression portions having a depth approximately corresponding to half a thickness of said coil body leg receiving regions and the central depression portion having a depth such that when the half-shells are mated and the central depression portions are facing each other, a central depression is created which has sufficient clearance to receive said coils therein;

said outer depressions of each half-shell forming bearing surfaces for said coil body tab-shaped core plate leg receiving portions; and each half-shell having a passage portion such that when the half-shells are mated, a passage is formed thereby for a lead cable connecting to the coils running from an exterior of the housing to an interior thereof.

2. A magnetic field probe according to claim 1 wherein both of said half-shells are identically shaped and wherein each half-shell has complementary fastening elements situated symmetrically relative to a center plane passing through a center line and perpendicular to a parting plane at which the two half shells mate; and said central depression and said outer depressions outwardly of said central depression being situated symmetrically relative to said center line.

3. A magnetic field probe according to claim 2 wherein said passage for said lead cable comprises a bore partly formed in each half-shell, an axis of said bore lying on said center line lying in said parting plane.

4. A magnetic field probe according to claim 3 wherein rib means are circumferentially provided in said passage as a tension safeguard for said cable.

5. A magnetic field probe according to claim 1 wherein each half-shell has a further depression means communicating with said passage for accepting solder terminals for said lead cable.

6. A magnetic field probe according to claim 1 wherein fastening means are provided for mating the two half-shells to one another and comprising in each half-shell at least two male plug-in members mateable with cooperating bores in the other half-shell.

7. A magnetic field probe according to claim 6 wherein walls of said bores have rib means parallel to an axis of said bores for providing a friction-type lock together with the male plug-in members.

8. A magnetic field probe according to claim 1 wherein one of the half-shells has a color different than a color of the other half-shell.

9. A magnetic field probe according to claim 1 wherein said coil body recess portion comprises a recessed region at one side thereof receiving said core plate, a depth of said recessed region corresponding to about a thickness of said core plate.

10. A magnetic field probe according to claim 9 wherein said core plate is fixed at at least one edge location by a hot deformation portion of said coil body.

11. A magnetic field probe according to claim 10 wherein said coil body has recess means for plug-type connection of center terminal lugs at a side facing said passage in said housing.

12. A magnetic field probe according to claim 1 wherein at least one of the half-shells has a surrounding rib connecting means for welding to the opposite half-shell.

13. A magnetic field probe, comprising:

a coil core plate of ferro-magnetic material having four legs outwardly extending and which form pole faces;

cut-out areas between said pole faces which respectively run approximately in a direction towards a center of the plate;

an insulating material plate-shaped coil body having cut-out areas defining tab-shaped regions, and having means comprising a recessed region having a contour matched to a contour of the core plate for receiving and aligning said core plate at one surface face thereof; first and second windings around the coil body and core plate and running in said cut-out areas;

a housing comprising mateable first and second half-shells, each half-shell having a central depression portion and an outer depression portion connected with the central depression portion to form within said housing a central depression region and an outer depression region connecting with the central depression region, said central depression region having dimensions sufficient to accommodate the windings and said outer depression region having a depth approximately the same as said core plate, said outer depression region including four tab-shaped bearing surfaces for said tabshaped coil body regions; and the housing having a passage running from an exterior thereof to an interior thereof in which a connecting cable is positioned for connection to the coils.

14. A magnetic field probe according to claim 13 wherein said means for receiving and aligning said core plate comprises rib means positioned adjacent at least a portion of an outer contour of the core plate for abutment therewith.

* * * * *